(12) United States Patent
Denda et al.

(10) Patent No.: US 8,329,494 B2
(45) Date of Patent: Dec. 11, 2012

(54) METHOD FOR MANUFACTURING SOLAR CELL

(75) Inventors: Atsushi Denda, Nagano (JP); Hiromi Saito, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 327 days.

(21) Appl. No.: 12/869,021

(22) Filed: Aug. 26, 2010

(65) Prior Publication Data

US 2011/0065230 A1 Mar. 17, 2011

(30) Foreign Application Priority Data

Sep. 15, 2009 (JP) ................................ 2009-213003

(51) Int. Cl.
*H01L 21/00* (2006.01)

(52) U.S. Cl. .......... 438/57; 136/244; 136/252; 136/256; 136/260; 136/264; 136/265; 257/21; 257/613; 438/48; 438/73; 438/80; 438/95; 438/98

(58) Field of Classification Search .................. 136/244, 136/252, 264, 265, 256, 260; 257/21, 613; 438/48, 57, 73, 80, 95, 98
See application file for complete search history.

(56) References Cited

U.S. PATENT DOCUMENTS

| | | | |
|---|---|---|---|
| 2002/0011641 A1* | 1/2002 | Oswald et al. | 257/447 |
| 2003/0180983 A1* | 9/2003 | Oswald et al. | 438/57 |
| 2005/0253142 A1 | 11/2005 | Negami et al. | |
| 2010/0059100 A1* | 3/2010 | Kim et al. | 136/244 |
| 2011/0126879 A1* | 6/2011 | Kitamura et al. | 136/244 |

FOREIGN PATENT DOCUMENTS

| | | |
|---|---|---|
| CN | 1682378 A | 10/2005 |
| JP | 2002-319686 A | 10/2002 |

* cited by examiner

*Primary Examiner* — Asok Sarkar

(74) *Attorney, Agent, or Firm* — Global IP Counselors, LLP

(57) ABSTRACT

A method for manufacturing a solar cell including a substrate, a first electrode layer, a semiconductor layer, and a second electrode layer, includes forming a first sacrificial layer on a portion of a surface of the substrate; forming the first electrode layer on the substrate and on the first sacrificial layer; and dividing the first electrode layer by removing the first sacrificial layer and a portion of the first electrode layer formed on the first sacrificial layer.

11 Claims, 3 Drawing Sheets

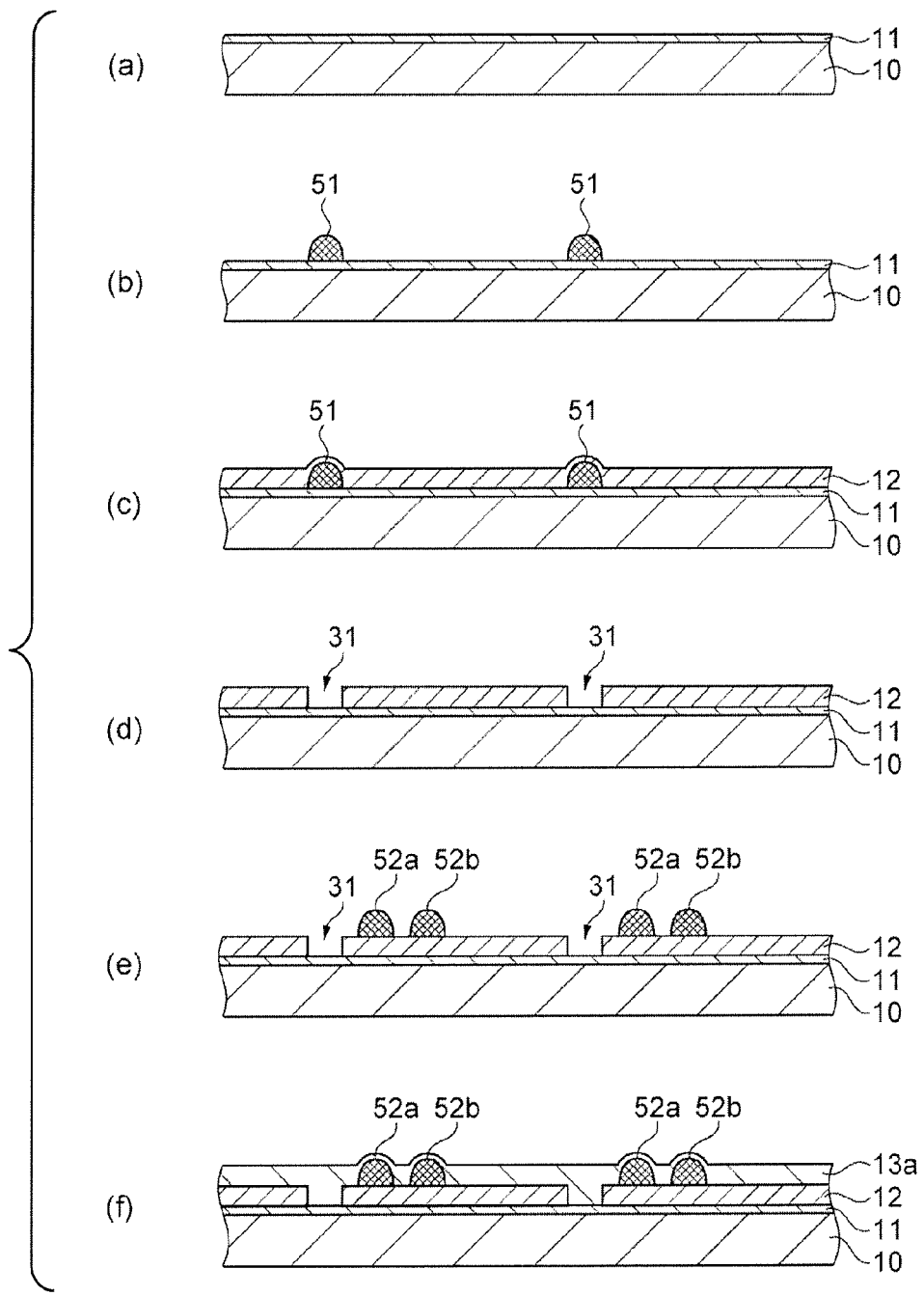
F I G. 2

METHOD FOR MANUFACTURING SOLAR CELL

CROSS-REFERENCE TO RELATED APPLICATIONS

This application claims priority to Japanese Patent Application No. 2009-213003 filed on Sep. 15, 2009. The entire disclosure of Japanese Patent Application No. 2009-213003 is hereby incorporated herein by reference.

BACKGROUND

1. Technical Field

The present invention relates to a method for manufacturing a solar cell.

2. Related Art

A solar cell converts light energy into electrical energy, and various types of configurations of solar cells have been proposed according to the semiconductor used. In recent years, CIGS-type solar cells have been emphasized for the simple manufacturing process thereof and the ability to realize high conversion efficiency. A CIGS solar cell is configured from a plurality of unit cells connected in a series, where one unit cell is composed, for example, of a first electrode film formed on a substrate, a thin film that includes a compound semiconductor (copper-indium-gallium-selenide) formed on the first electrode film, and a second electrode film that is formed on the thin film. The second electrode film is formed in a groove in which a portion of the thin film has been removed, and the first electrode film and second electrode film are electrically connected (see Japanese Laid-Open Patent Publication No. 2002-319686, for example).

SUMMARY

The solar cell described above is divided into unit cells by removing portions of the first electrode film, the thin film, and the second electrode film. Laser light irradiation, a metal needle, or the like is used in this division process (scribing process). However, since the power is difficult to adjust in the scribing process using laser light irradiation, a metal needle, or the like, the lower film is sometimes damaged in cases in which a high pressure is exerted by the metal needle, for example. On the other hand, when the pressure is too weak, the film is not adequately removed, thereby causing short-circuiting or high resistance. In cases in which the portion of the surface of the film being scribed is irregular, the metal needle does not make uniform contact with the film surface when the metal needle or the like is brought into contact with the film surface, and stress is therefore concentrated at the depressed or protruding portions, which causes cracks to form in the film and other portions.

The present invention was developed in order to overcome at least some of the problems described above, and the present invention can be implemented in the form of the embodiments or applications described below.

A method for manufacturing a solar cell according to a first aspect is a method for forming a solar cell including a substrate, a first electrode layer, a semiconductor layer, and a second electrode layer. The method includes: forming a first sacrificial layer on a portion of a surface of the substrate; forming the first electrode layer on the substrate and on the first sacrificial layer; and dividing the first electrode layer by removing the first sacrificial layer and a portion of the first electrode layer formed on the first sacrificial layer.

According to this configuration, a first sacrificial layer is formed on the substrate, and a first electrode layer is then formed on the substrate and on the first sacrificial layer. The first electrode layer is then divided by removing the first sacrificial layer as well as the first electrode layer that is formed on the first sacrificial layer. Specifically, the first sacrificial layer is formed in advance on the portion for dividing the first electrode layer, and the first electrode layer is divided using a lift-off method. Consequently, there is no need for a conventional scribing process using laser light irradiation, a metal needle, or the like. It is therefore possible to reduce damage to the first electrode layer, the substrate under the first electrode layer, and other members during division of the first electrode layer.

A method for manufacturing a solar cell according to a second aspect is a method for manufacturing a solar cell including a substrate, a first electrode layer, a semiconductor layer, and a second electrode layer. The method includes: forming the first electrode layer on the substrate; forming a sacrificial layer on a portion of a surface of the first electrode layer; forming the semiconductor layer on the first electrode layer and on the sacrificial layer; and dividing the semiconductor layer by removing the sacrificial layer and a portion of the semiconductor layer formed on the sacrificial layer.

According to this configuration, a sacrificial layer is formed on the first electrode layer, and a semiconductor layer is then formed on the first electrode layer and on the sacrificial layer. The semiconductor layer is then divided by removing the sacrificial layer as well as the semiconductor layer that is formed on the sacrificial layer. Specifically, the sacrificial layer is formed in advance on the portion for dividing the semiconductor layer, and the semiconductor layer is divided using a lift-off method. Consequently, there is no need for a conventional scribing process using laser light irradiation, a metal needle, or the like. It is therefore possible to reduce damage to the semiconductor layer, the first electrode layer under the semiconductor layer, and other members during division of the semiconductor layer.

A method for manufacturing a solar cell according to a third aspect is a method for manufacturing a solar cell including a substrate, a first electrode layer, a semiconductor layer, and a second electrode layer. The method includes: forming the first electrode layer on the substrate; forming the semiconductor layer on the first electrode layer; forming a sacrificial layer on a portion of a surface of the semiconductor layer; forming the second electrode layer on the semiconductor layer and on the sacrificial layer; and dividing the second electrode layer by removing the sacrificial layer and a portion of the second electrode layer formed on the sacrificial layer.

According to this configuration, a sacrificial layer is formed on the first electrode layer, and a second electrode layer is then formed on the semiconductor layer and on the sacrificial layer. The second electrode layer is then divided by removing the sacrificial layer as well as the second electrode layer that is formed on the sacrificial layer. Specifically, the sacrificial layer is provided in advance on the portion for dividing the second electrode layer, and the second electrode layer is divided using a lift-off method. Consequently, there is no need for a conventional scribing process using laser light irradiation, a metal needle, or the like. It is therefore possible to reduce damage to the second electrode layer, the first electrode layer under the second electrode layer, and other members during division of the second electrode layer.

In the above described method according to the first, second or third aspect, the forming of the sacrificial layer preferably includes applying a negative-type photosensitive resin as a sacrificial layer formation material and drying the negative-type photosensitive resin According to this configuration, the sacrificial layer can easily be formed using a printing method, an inkjet method, or other method, for example.

In the above described method according to the first, second or third aspect, the forming of the sacrificial layer preferably includes forming the sacrificial layer to have a thickness greater than a thickness of the layer formed on the sacrificial layer.

According to this configuration, since the layer formed on the sacrificial layer has a thickness less than that of the sacrificial layer, the layer formed on the sacrificial layer can easily be removed.

BRIEF DESCRIPTION OF THE DRAWINGS

Referring now to the attached drawings which form a part of this original disclosure:

FIG. 2 is a process view showing the method for manufacturing a solar cell according to the embodiment.

DETAILED DESCRIPTION OF EXEMPLARY EMBODIMENTS

Figure 1:
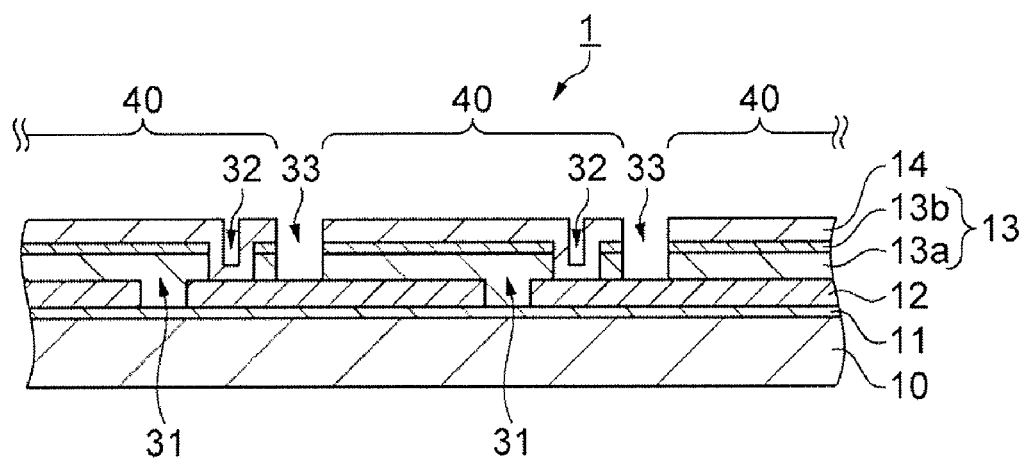
FIG. 1 is a view showing the structure of the solar cell according to an embodiment.

An embodiment of the present invention will be described hereinafter with reference to the drawings. Each of the members shown in the drawings is shown sufficiently large to recognize, and members are not shown to scale in relation to each other.

Structure of Solar Cell

The structure of the solar cell will first be described. In the present embodiment, the structure of a CIGS-type solar cell will be described. FIG. 1 is a sectional view showing the structure, of the solar cell according to the present embodiment.

As shown in FIG. 1, the solar cell 1 is has an aggregate of a plurality of unit cells 40 that are composed of a substrate 10; a base layer 11 formed on the substrate 10; a first electrode layer 12 formed on the base layer 11; a semiconductor layer 13 formed on the first electrode layer 12; and an second electrode layer 14 formed on the semiconductor layer 13.

The first electrode layer 12 is divided for each unit cell 40 by first dividing grooves 31, and the first electrode layer 12 is formed so as to bridge the spaces between adjacent unit cells 40. The semiconductor layer formed on the first electrode layer 12 is divided for each unit cell 40 by second dividing grooves 32, and the second electrode layer 14 is divided for each unit cell 40 by third dividing grooves 33. The first electrode layer 12 and the second electrode layer 14 are thereby electrically connected via the second dividing grooves 32. The second electrode layer 14 of each unit cell 40 and the first electrode layer 12 of the other adjacent unit cells 40 are thereby connected, and the unit cells 40 are connected in series. The desired voltage in the solar cell 1 can thus be designed and changed to any value by appropriately setting the number of unit cells 40 that are connected in series.

The substrate 10 is a substrate in which at least the surface thereof on the side of the first electrode layer 12 has insulating properties. Specific examples of substrates that can be used include glass (blue sheet glass or the like) substrates, stainless steel substrates, polyimide substrates, and carbon substrates.

The base layer 11 is a layer having insulating properties that is formed on the substrate 10, and an insulation layer primarily composed of $SiO_2$ (silicon dioxide), or an iron fluoride layer may be provided. The base layer 11 has insulation properties, and has the function of maintaining adhesion between the substrate 10 and the first electrode layer 12 formed on the substrate 10. The base layer 11 may be omitted when the substrate 10 has the characteristics described above.

The first electrode layer 12 is formed on the base layer 11. The first electrode layer 12 is electrically conductive, and may be formed using molybdenum (Mo), for example.

The semiconductor layer 13 is composed of a first semiconductor layer 13a and a second semiconductor layer 13b. The first semiconductor layer 13a is formed on the first electrode layer 12, and is a p-type semiconductor layer that includes copper (Cu), indium (In), gallium (Ga), and selenium (Se) (CIGS semiconductor layer).

The second semiconductor layer 13b is formed on the first semiconductor layer 13a, and is a cadmium sulfide (CdS), zinc oxide (ZnO), indium sulfide (InS), or other n-type semiconductor layer.

The second electrode layer 14 is a transparent electrode layer, and is composed of ZnOAl or another transparent electrode (TCO: transparent conducting oxides), AZO, or the like. The second electrode layer 14 is formed on the second semiconductor layer 13b and in the second dividing grooves 32, and the first electrode layer 12 and the second electrode layer 14 are electrically connected.

When sunlight or other light is incident on the CIGS-type solar cell 1 configured as described above, electrons (−) and positive holes (+) occur in pairs in the semiconductor layer 13, and the electrons (−) collect in the n-type semiconductor layer, and the positive holes (+) collect in the p-type semiconductor layer at the joint surface between the p-type semiconductor layer (first semiconductor layer 13a) and the n-type semiconductor layer (second semiconductor layer 13b). As a result, an electromotive force occurs between the n-type semiconductor layer and the p-type semiconductor layer. In this state, a current can be directed to the outside by connecting an external conductor to the first electrode layer 12 and the second electrode layer 14.

Method For Manufacturing Solar Cell

Figure 3:
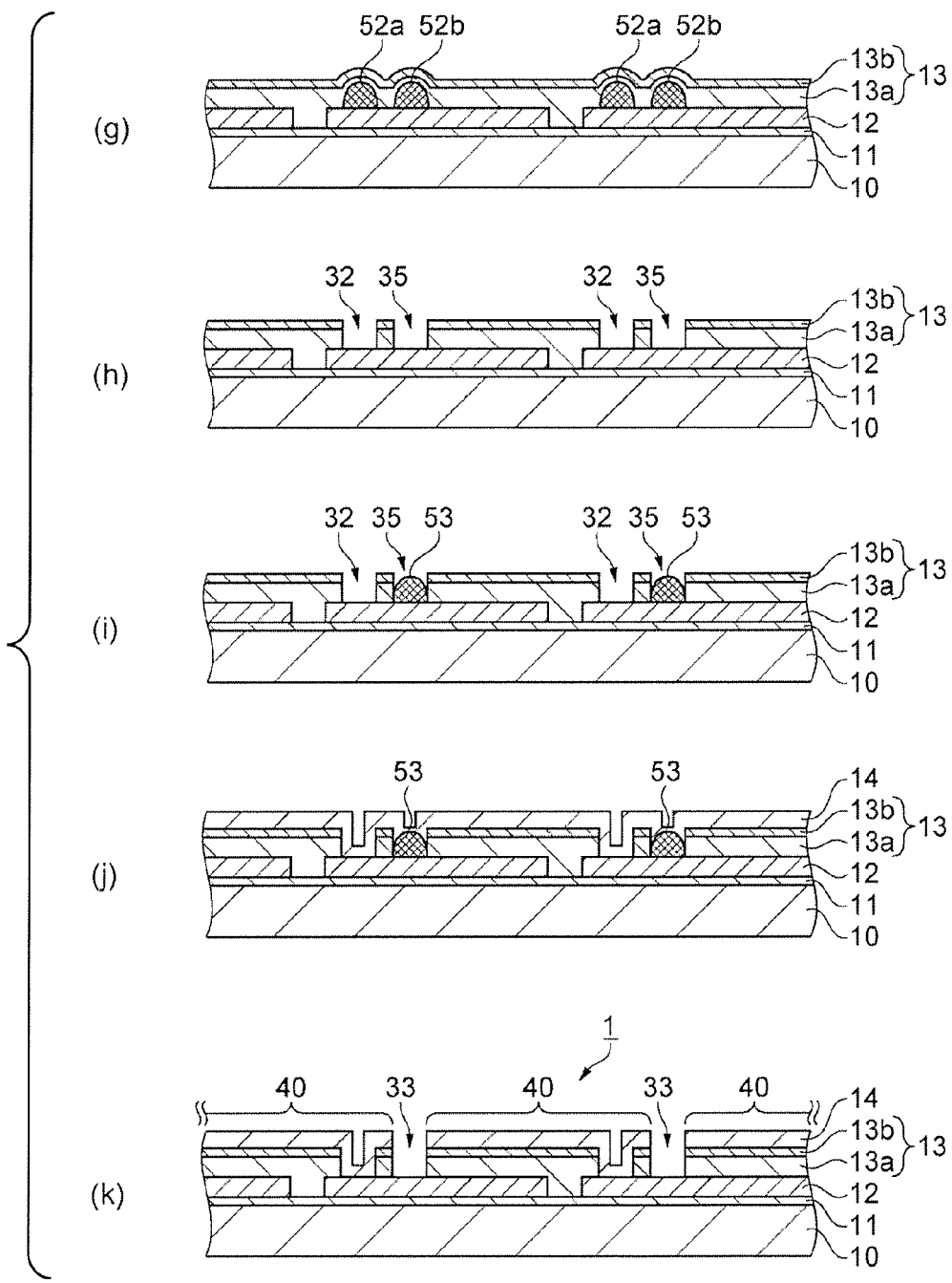
FIG. 3 is a process view showing the method for manufacturing a solar cell according to the embodiment.

The method for manufacturing the solar cell will next be described. In the present embodiment, a method for manufacturing a CIGS-type solar cell will be described. FIGS. 2 and 3 are process views showing the method for manufacturing a solar cell according to the present embodiment.

In a base layer formation step shown in FIG. 2(a), a base layer 11 composed of iron fluoride is formed on one surface of a stainless steel substrate 10. The base layer 11 composed of iron fluoride can be formed by reacting fluoride gas with the stainless steel substrate 10 by heat treatment. The base layer formation step may be omitted when the substrate 10 as such has the effects of the base layer described above.

In a first sacrificial layer formation step shown in FIG. 2(b), first sacrificial layers 51 are formed on portions of the surface of the base layer 11 that correspond to the removed portions of the first electrode layer 12. Specifically, as shown in FIG. 1, the first sacrificial layers 51 are formed on portions of the surface of the base layer 11 in the regions where the first dividing grooves 31 are formed for dividing the first electrode layer 12 for each unit cell 40. Specifically, a negative-type photosensitive resin used for a lift-off method is applied as the material forming the first sacrificial layers 51 on portions of the surface of the base layer 11 using a printing method, an inkjet method, or another method. The applied negative-type photosensitive resin is then dried to form the first sacrificial layers 51.

Examples of mixtures that may be used as the negative-type photosensitive composition include a mixture of cyclized isoprene rubber and a bisazide compound; a mixture of polyvinyl phenol resin and an azide compound; a soluble polyimide having a photo-polymerizable olefin; a self-sensitizing polyimide having a benzophenone backbone and an alkyl group in the ortho position of an aromatic ring to which a nitrogen atom is bonded; a mixture of a photoacid generator that generates acid in response to light irradiation and melamine-formaldehyde resin, alkyl etherified melamine resin, benzoquanamine resin, alkyl etherified benzoquanamine resin, urea resin, alkyl etherified urea resin, urethane-formaldehyde resin, resole-type phenol formaldehyde resin, alkyl etherified resole-type phenol formaldehyde resin, or epoxy resin; or other mixtures.

The first sacrificial layers 51 are formed so as to have a greater thickness than the first electrode layer 12 formed in the subsequent step. For example, the first sacrificial layers 51 are formed so as to have about 1.5 times the thickness of the first electrode layer 12. This thickness is achieved by appropriately adjusting such factors as the amount of negative-type photosensitive resin that is applied.

In a first electrode layer formation step shown in FIG. 2(*c*), the first electrode layer 12 is formed on the base layer 11 and the first sacrificial layer 51. Specifically, a molybdenum (Mo) layer as the first electrode layer 12 is formed by sputtering.

In a first electrode layer division step shown in FIG. 2(*d*), portions of the first electrode layer 12 are removed and the first electrode layer 12 is divided for each unit cell 40. Specifically, the intermediate of the solar cell 1 is dipped in a release solution for a lift-off method, and the first sacrificial layers 51 as well as the first electrode layer 12 formed on the first sacrificial layers 51 are released (removed).

An alkaline aqueous solution is preferred as the release solution, and examples of such solutions that can be used include an aqueous solution of tetramethylammonium hydroxide, an aqueous solution of KOH, ozonated water, and the like. The first dividing grooves 31 are formed where portions of the first electrode layer 12 were removed.

In a second sacrificial layer formation step shown in FIG. 2(*e*), second sacrificial layers 52*a*, 52*b* are formed on portions of the surface of the first electrode layer 12 that correspond to the removed portions of the semiconductor layer 13. Specifically, a negative-type photosensitive resin used for a lift-off method is applied as the material forming the second sacrificial layers 52 on portions of the surface of the first electrode layer 12 using a printing method, an inkjet method, or another method. The applied negative-type photosensitive resin is then dried to form the second sacrificial layers 52*a*, 52*b*. The same photosensitive resin described for use in the first sacrificial layer formation step can be used as the negative-type photosensitive resin. The second sacrificial layers 52*a*, 52*b* are formed so as to have a greater thickness than the semiconductor layer 13 formed in the subsequent step. For example, the second sacrificial layers 52*a*, 52*b* are formed so as to have about 1.5 times the thickness of the semiconductor layer 13. This thickness is achieved by appropriately adjusting such factors as the amount of negative-type photosensitive resin that is applied.

The semiconductor layer formation step will next be described. The semiconductor layer formation step includes a first semiconductor layer formation step and a second semiconductor layer formation step. In a first semiconductor layer formation step shown in FIG. 2(*f*), copper (Cu), indium (In), and gallium (Ga) are applied by sputtering or another method on the first electrode layer 12, inside the first dividing grooves 31, and on the second sacrificial layers 52*a*, 52*b*, and a precursor is formed. The precursor is then heated in a hydrogen selenide atmosphere (selenized), and a p-type semiconductor layer (CIGS) is formed as a first semiconductor layer 13*a*.

In a second semiconductor layer formation step shown in FIG. 3(*g*), an n-type semiconductor layer as a second semiconductor layer 13*b* composed of CdS, ZnO, InS, or the like is formed on the first semiconductor layer 13*a*. The second semiconductor layer 13*b* can be formed by sputtering or another method.

In a semiconductor layer division step shown in FIG. 3(*h*), portions of the semiconductor layer 13 are removed, and the semiconductor layer 13 is divided for each unit cell 40. Specifically, the intermediate of the solar cell 1 is dipped in a release solution for a lift-off method, and the second sacrificial layers 52*a*, 52*b* as well as the semiconductor layer 13 formed on the second sacrificial layers 52*a*, 52*b* are released (removed). The same solution described for use in the first sacrificial layer formation step can be used as the release solution. Second dividing grooves 32 in which the semiconductor layer 13 is divided for each unit cell 40, and preliminary grooves 35 for dividing the second electrode layer for each unit cell 40 in a subsequent step are foamed in the removed portions of the semiconductor layer 13.

In a third sacrificial layer formation step shown in FIG. 3(*i*), third sacrificial layers 53 are formed in the preliminary grooves 35, i.e., on portions of the surface of the first electrode layer 12 that correspond to the removed portions of the second electrode layer 14. Specifically, a negative-type photosensitive resin used for a lift-off method is applied as the material forming the third sacrificial layers 53 on portions of the surface of the first electrode layer 12 using a printing method, an inkjet method, or another method. The applied negative-type photosensitive resin is then dried to form the third sacrificial layers 53. The same photosensitive resin described for use in the first sacrificial layer formation step can be used as the negative-type photosensitive resin. The third sacrificial layers 53 are formed so as to have a greater thickness than the second electrode layer 14 formed in the subsequent step. For example, the third sacrificial layers 53 are formed so as to have about 1.5 times the thickness of the second electrode layer 14. This thickness is achieved by appropriately adjusting such factors as the amount of negative-type photosensitive resin that is applied.

In a second electrode layer formation step shown in FIG. 3(*j*), the second electrode layer 14 is formed on the semiconductor layer 13, in the second dividing grooves 32, and on the third sacrificial layers 53. For example, ZnOAl or another transparent electrode (TCO) is formed as the second electrode layer by sputtering or another method.

In a second electrode layer division step shown in FIG. 3(*k*), portions of the second electrode layer 14 are removed, and the second electrode layer 14 is divided for each unit cell 40. Specifically, the intermediate of the solar cell 1 is dipped in a release solution for a lift-off method, and the third sacrificial layers 53 as well as the second electrode layer 14 formed on the third sacrificial layers 53 are released (removed). The same solution described for use in the first sacrificial layer formation step can be used as the release solution. Third dividing grooves 33 in which the second electrode layer 14 is divided for each unit cell 40 are formed in the removed portions of the second electrode layer 14.

By the process described above, a CIGS-type solar cell 1 is formed in which a plurality of unit cells 40 is connected in series.

The effects described below are obtained through the embodiment described above.

(1) The first sacrificial layers 51 are formed on the base layer 11 provided to the substrate 10, and the first electrode layer 12 is then formed on the base layer 11 and on the first sacrificial layers 51. The first electrode layer 12 is then divided for each unit cell 40 by removing the first sacrificial layers 51 as well as the first electrode layer 12 that is formed on the first sacrificial layers 51. Consequently, there is no need for a conventional scribing process using laser light irradiation, a metal needle, or the like. It is therefore possible to reduce damage to the first electrode layer 12, the base layer 11 or substrate 10 under the first electrode layer 12, and other members during division of the first electrode layer 12.

(2) The second sacrificial layers 52a are formed on the first electrode layer 12, and the semiconductor layer 13 is then formed on the first electrode layer 12 and on the second sacrificial layers 52a. The semiconductor layer 13 is then divided for each unit cell 40 by removing the second sacrificial layers 52a as well as the semiconductor layer 13 that is formed on the second sacrificial layers 52a. Consequently, there is no need for a conventional scribing process using laser light irradiation, a metal needle, or the like, making it possible to reduce damage to the semiconductor layer 13, the first electrode layer 12 under the semiconductor layer 13, and other members during division of the semiconductor layer 13.

(3) The third sacrificial layers 53 are formed on the first electrode layer 12, and the second electrode layer 14 is then formed on the semiconductor layer 13 and on the third sacrificial layers 53. The second electrode layer 14 is divided for each unit cell 40 by removing the third sacrificial layers 53 as well as the second electrode layer 14 that is formed on the third sacrificial layers 53. Consequently, there is no need for a conventional scribing process using laser light irradiation, a metal needle, or the like. It is therefore possible to reduce damage to the second electrode layer 14, the first electrode layer 12 under the second electrode layer 14, and other members during division of the second electrode layer 14.

The present invention is not limited to the embodiments described above, and may include such modifications as those described below.

MODIFICATION 1

First through third sacrificial layers 51 through 53 are formed in the embodiment described above, but all of the first through third sacrificial layers 51 through 53 need not necessarily be formed. For example, any of the first through third sacrificial layers 51 through 53 may be selected to be formed as appropriate according to the characteristics, scribing properties, and other properties of the first electrode layer 12, the semiconductor layer 13, and the second electrode layer 14. For example, a configuration may be adopted in which the first sacrificial layers 51 are formed, the first electrode layer 12 is divided for each unit cell 40 by removing the first sacrificial layers 51 as well as the first electrode layer 12 that is formed on the first sacrificial layers 51, and the semiconductor layer 13 and second electrode layer 14 are divided for each unit cell 40 by a metal needle or laser light irradiation. The degree of freedom of manufacturing design can thereby be increased.

MODIFICATION 2

In the embodiment described above, a description is provided of the structure and other aspects of a CIGS-type solar cell 1, for receiving light from the side of the second electrode layer 14, but the solar cell 1 may also be a CIGS-type solar cell 1 that is capable of receiving light from the side of the substrate 10 as well as from the side of the second electrode layer 14. In this case, a transparent substrate is used as the substrate 10. For example, a glass substrate, a PET substrate, an organic transparent substrate, or the like may be used. Using a transparent substrate enables light to be received from the surface of the substrate 10. The first electrode layer 12 is a transparent electrode layer, and is a ZnOAl or other transparent electrode (TCO: transparent conducting oxides) layer, for example. By forming a transparent electrode layer, light that is incident from the side of the substrate 10 can be made to pass through to reach the semiconductor layer 13. The same effects as those described above can be obtained through this configuration as well.

MODIFICATION 3

In the embodiment described above, a configuration and method for manufacturing a CIGS-type solar cell 1 are described, but this configuration is not limiting. The present invention may also be applied to another compound semiconductor solar cell, e.g., a CdTe-type solar cell. The present invention may also be applied to an Si-type solar cell, e.g., an Si thin-film solar cell. The same effects as those described above can be obtained through this configuration as well.

GENERAL INTERPRETATION OF TERMS

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. A method for manufacturing a solar cell including a substrate, a first electrode layer, a semiconductor layer, and a second electrode layer, the method comprising:
    forming a first sacrificial layer on a portion of a surface of the substrate;
    forming the first electrode layer on the substrate and on the first sacrificial layer; and dividing the first electrode layer by removing the first sacrificial layer and a portion of the first electrode layer formed on the first sacrificial layer.

2. The method for manufacturing a solar cell according to claim 1, wherein
the forming of the first sacrificial layer includes applying a negative-type photosensitive resin as a sacrificial layer formation material on the portion of the surface of the substrate and drying the negative-type photosensitive resin.

3. The method for manufacturing a solar cell according to claim 1, wherein
the forming of the first sacrificial layer includes forming the first sacrificial layer to have a thickness greater than a thickness of the first electrode layer.

4. The method for manufacturing a solar cell according to claim 1, further comprising
forming a second sacrificial layer on a portion of a surface of the first electrode layer;
forming the semiconductor layer on the first electrode layer and on the second sacrificial layer; and
dividing the semiconductor layer by removing the second sacrificial layer and a portion of the semiconductor layer formed on the second sacrificial layer.

5. The method for manufacturing a solar cell according to claim 4, further comprising
forming a third sacrificial layer on a portion of a surface of the semiconductor layer;
forming the second electrode layer on the semiconductor layer and on the third sacrificial layer; and
dividing the second electrode layer by removing the third sacrificial layer and a portion of the second electrode layer formed on the third sacrificial layer.

6. A method for manufacturing a solar cell including a substrate, a first electrode layer, a semiconductor layer, and a second electrode layer, the method comprising:
forming the first electrode layer on the substrate;
forming a sacrificial layer on a portion of a surface of the first electrode layer;
forming the semiconductor layer on the first electrode layer and on the sacrificial layer; and
dividing the semiconductor layer by removing the sacrificial layer and a portion of the semiconductor layer formed on the sacrificial layer.

7. The method for manufacturing a solar cell according to claim 6, wherein
the forming of the sacrificial layer includes applying a negative-type photosensitive resin as a sacrificial layer formation material on the portion of the surface of the first electrode layer and drying the negative-type photosensitive resin.

8. The method for manufacturing a solar cell according to claim 6, wherein
the forming of the sacrificial layer includes forming the sacrificial layer to have a thickness greater than a thickness of the semiconductor layer.

9. A method for manufacturing a solar cell including a substrate, a first electrode layer, a semiconductor layer, and a second electrode layer, the method comprising:
forming the first electrode layer on the substrate;
forming the semiconductor layer on the first electrode layer;
forming a sacrificial layer on a portion of a surface of the first electrode layer;
forming the second electrode layer on the semiconductor layer and on the sacrificial layer; and
dividing the second electrode layer by removing the sacrificial layer and a portion of the second electrode layer formed on the sacrificial layer.

10. The method for manufacturing a solar cell according to claim 9, wherein
the forming of the sacrificial layer includes applying a negative-type photosensitive resin as a sacrificial layer formation material on the portion of the surface of the semiconductor layer and drying the negative-type photosensitive resin.

11. The method for manufacturing a solar cell according to claim 9, wherein
the forming of the sacrificial layer includes forming the sacrificial layer to have a thickness greater than a thickness of the second electrode layer.

* * * * *